US012431681B2

(12) United States Patent
Welches et al.

(10) Patent No.: US 12,431,681 B2
(45) Date of Patent: Sep. 30, 2025

(54) FIBER LASER FOR COAGULATION, CUTTING, AND OTHER OPERATIONS

(71) Applicant: InnoVoyce LLC, Boston, MA (US)

(72) Inventors: Richard Shaun Welches, Townsend, MA (US); Stephen Neal Mais, Boston, MA (US)

(73) Assignee: Inno Voyce LLC, Boston, MA (US)

( * ) Notice: Subject to any disclaimer, the term of this patent is extended or adjusted under 35 U.S.C. 154(b) by 1 day.

(21) Appl. No.: 18/662,720

(22) Filed: May 13, 2024

(65) Prior Publication Data

US 2025/0183609 A1 Jun. 5, 2025

Related U.S. Application Data

(60) Provisional application No. 63/604,618, filed on Nov. 30, 2023.

(51) Int. Cl.
*H01S 3/00* (2006.01)
*H01S 3/094* (2006.01)
*H01S 3/10* (2006.01)

(52) U.S. Cl.
CPC ...... *H01S 3/0071* (2013.01); *H01S 3/094069* (2013.01); *H01S 3/10015* (2013.01)

(58) Field of Classification Search
CPC ............ H01S 3/0071; H01S 3/094069; H01S 3/10015
See application file for complete search history.

(56) References Cited

U.S. PATENT DOCUMENTS 5,098,427 A 3/1992 Hessel et al.
6,538,817 B1 * 3/2003 Farmer ............ G01N 21/4795
359/618

(Continued)

FOREIGN PATENT DOCUMENTS

CN 105664372 B 6/2018
CN 110426782 A 8/2019
(Continued)

OTHER PUBLICATIONS

NIR Detector, FTO Search Results, dated Oct. 4, 2023, 50 pages.
(Continued)

*Primary Examiner* — Xinning(Tom) Niu
(74) *Attorney, Agent, or Firm* — Morgan, Lewis & Bockius LLP

(57) ABSTRACT

The present disclosure relates to a laser device with multi-mode capabilities, enabling the performance of surgical procedures without the need to use multiple lasers. The laser device includes a signal generator configured to generate a laser control signal. The laser device also includes a laser source configured to receive the laser control signal and emit a laser beam responsive to receiving the laser control signal and in accordance with the laser control signal. Additionally, the laser device includes control circuitry. The control circuitry is configured to receive a user request to operate in either a pulsed-wave mode, a quasi-pulsed-wave mode, a continuous-wave mode, or a quasi-continuous-wave mode. The control circuitry is also configured to cause the signal generator to generate the laser control signal in accordance with the requested mode, thereby causing the laser source to emit a pulsed-wave laser, a quasi-pulsed-wave laser, a continuous-wave laser, or a quasi-continuous-wave laser.

21 Claims, 3 Drawing Sheets

(56) References Cited

U.S. PATENT DOCUMENTS

| | | | |
|---|---|---|---|
| 6,932,809 B2 | 8/2005 | Sinofsky | |
| 7,006,749 B2 | 2/2006 | Illich et al. | |
| 7,305,163 B2 | 12/2007 | Williams | |
| 7,455,638 B2 | 11/2008 | Ogawa et al. | |
| 7,869,016 B2 | 1/2011 | Mitchell et al. | |
| 8,294,879 B2 | 10/2012 | Silny et al. | |
| 8,455,025 B2 | 6/2013 | Stern et al. | |
| 8,475,025 B2 | 7/2013 | Ott et al. | |
| 8,638,428 B2 | 1/2014 | Brown | |
| 8,740,958 B2 | 6/2014 | Anderson et al. | |
| 8,790,253 B2 * | 7/2014 | Sunagawa | A61B 1/0661 600/109 |
| 8,956,343 B2 | 2/2015 | Belikov et al. | |
| 9,134,171 B2 | 9/2015 | Blomster et al. | |
| 9,216,059 B2 | 12/2015 | Rink et al. | |
| 9,259,270 B2 | 2/2016 | Brown | |
| 9,267,330 B2 | 2/2016 | Rinzler et al. | |
| 9,314,303 B2 | 4/2016 | Brown | |
| 10,135,216 B1 | 11/2018 | Brown | |
| 10,420,458 B2 | 9/2019 | Sinofsky | |
| 10,591,657 B2 | 3/2020 | Kadokura et al. | |
| 10,617,470 B2 | 4/2020 | Xuan et al. | |
| 10,667,863 B2 | 6/2020 | Chia et al. | |
| 10,702,338 B2 | 7/2020 | Shazly et al. | |
| 11,549,651 B2 | 1/2023 | Krijn et al. | |
| 2004/0133190 A1 | 7/2004 | Hobart et al. | |
| 2007/0016176 A1 | 1/2007 | Boutoussov et al. | |
| 2007/0239232 A1 | 10/2007 | Kurtz et al. | |
| 2008/0165337 A1 | 7/2008 | Ershov et al. | |
| 2009/0149845 A1 | 6/2009 | Brown | |
| 2009/0177191 A1 | 7/2009 | Brown | |
| 2009/0180498 A1 * | 7/2009 | Schmidt | H01S 3/005 372/21 |
| 2010/0316072 A1 * | 12/2010 | Deladurantaye | H01S 5/06216 372/29.02 |
| 2011/0261456 A1 * | 10/2011 | Raab | H01S 3/082 359/489.08 |
| 2012/0232534 A1 | 9/2012 | Rink et al. | |
| 2017/0042618 A1 | 2/2017 | Brown | |
| 2017/0231553 A1 | 8/2017 | Igarashi et al. | |
| 2018/0278013 A1 * | 9/2018 | Kanskar | H01S 3/0401 |
| 2019/0076668 A1 | 3/2019 | McLay-Brown et al. | |
| 2020/0405410 A1 | 12/2020 | Shelton, IV | |
| 2021/0000567 A1 | 1/2021 | Sutter et al. | |
| 2022/0094132 A1 | 3/2022 | Sakamoto et al. | |
| 2022/0117649 A1 | 4/2022 | Reiterer et al. | |
| 2022/0133172 A1 | 5/2022 | Ransbury et al. | |
| 2022/0175449 A1 | 6/2022 | Assa et al. | |
| 2024/0016543 A1 | 1/2024 | Altshuler et al. | |

FOREIGN PATENT DOCUMENTS

| | | |
|---|---|---|
| CN | 112864784 A | 5/2021 |
| CN | 218885370 U | 4/2023 |
| CN | 116407270 A | 7/2023 |
| EP | 0424272 A2 | 10/1990 |
| EP | 0844472 A1 | 5/1998 |
| EP | 1204850 A1 | 2/2001 |
| EP | 2736439 B1 | 6/2014 |
| EP | 4179600 A1 | 2/2022 |
| JP | 2001149380 A | 6/2001 |
| JP | 3695901 B2 | 9/2005 |
| JP | 2014200815 A | 10/2014 |
| JP | 2015065302 A | 4/2015 |
| JP | 2015199117 A | 11/2015 |
| JP | 2016191895 A | 11/2016 |
| JP | 7145630 B2 | 10/2022 |
| WO | 2009146561 A1 | 12/2009 |

OTHER PUBLICATIONS

NIR Detector, Patentability Search Results, dated Oct. 4, 2023, 36 pages.

International Search Report dated Jan. 15, 2025 for PCT/US2024/057774, 2 pages.

* cited by examiner

FIBER LASER FOR COAGULATION, CUTTING, AND OTHER OPERATIONS

PRIORITY

The present application claims priority to U.S. Provisional App. No. 63/604,618 (filed Nov. 30, 2023), which is hereby incorporated by reference.

TECHNICAL FIELD

The present disclosure relates, generally, to laser technologies and, more specifically, to fiber lasers for use in surgery, biomedicine, and other pertinent fields.

BACKGROUND

In recent years, fiber optic lasers have revolutionized surgical procedures, offering unprecedented levels of precision and flexibility. Whereas traditional surgical techniques often required large incisions, fiber lasers allow surgeons to minimize tissue trauma during surgery. Additionally, the flexibility and small size of fiber lasers allow surgeons to access to hard-to-reach areas within the body, expanding the scope of potential surgical interventions.

Notwithstanding the many advancements in this field, there remain opportunities for further improvements to fiber laser technologies. State-of-the-art surgical lasers, for instance, are still fairly limited in their ability to emit lasers for performing multiple different steps in a given surgical procedure. Additional development to fiber laser technologies promises to further aid surgeons in conducting surgeries therewith, as well as all others that employ fibers lasers in their respective fields.

SUMMARY

Many surgical procedures require blood vessel coagulation, as well as the cutting or removal of tissue. Tumor treatments, for example, oftentimes require the selective coagulation of the blood vessels feeding a tumor, followed by the ablation or excision of that tumor. These sorts of surgical procedures generally require multiple fiber lasers, one for coagulation and one for ablation or excision.

Surgeries that require multiple lasers are complicated, especially when the surgery is performed endoscopically or laryngoscopically. Maneuvering the fiber laser to the surgical site takes effort, time, and skill. And this is compounded when the fiber laser must be removed and replaced with another laser mid-surgery because the first laser was specialized for a first operation (e.g., coagulation) and the second laser is needed for a second operation (e.g., ablation). The optical waveguide coupled to the fiber laser is oftentimes sterile and intended only for single use. Accordingly, laser swaps generally also require replacing the optical waveguide, as well.

An ideal fiber laser would be capable of handling each or at least multiple of the laser-driven operations in a given surgical procedure. This would not only simplify the surgery, but it would reduce waste, expedite the procedure, and keep costs down, as well. The present disclosure provides such a laser, with various innovations that allow fiber lasers to operate with increased versatility. The subject technology allows a surgeon, for instance, to selectively coagulate blood vessels and then to ablate tissue with a single fiber laser apparatus. The fiber laser may accomplish this by surgeon-driven selection of a first operating mode for coagulation (e.g., characterized by short pulse duration) and a second operating mode for tissue ablation (e.g., characterized by longer pulse duration or continuous waves).

Example Embodiments Include the Following

A laser device includes a signal generator, a laser source, and control circuitry. The signal generator is configured to separately generate two or more of a pulsed-wave signal, a quasi-pulsed-wave signal, a continuous-wave signal, and a quasi-continuous-wave signal for transmission as a laser control signal. The laser source is configured to receive the laser control signal and emit a laser beam responsive to receiving the laser control signal and in accordance with the laser control signal. The laser beam is either a pulsed-wave laser beam, a quasi-pulsed-wave laser beam, a continuous-wave laser beam, or a quasi-continuous-wave laser beam. The control circuitry is configured to receive a user request to operate in a requested mode, where the requested mode is either a pulsed-wave mode, a quasi-pulsed-wave mode, a continuous-wave mode, or a quasi-continuous-wave mode. The control circuitry is also configured to generate the laser control signal responsive to receiving the user request and in accordance with the requested mode. Moreover, an optical waveguide is configured to emit the laser beam from a second end of the optical waveguide after receiving the laser beam at a first end of the optical waveguide.

A laser system includes a signal generator, a laser source, an optical waveguide, and control circuitry. The signal generator is configured to separately generate two or more of a pulsed-wave signal, a quasi-pulsed-wave signal, a continuous-wave signal, and a quasi-continuous-wave signal for transmission as a laser control signal. The laser source is configured to receive the laser control signal and emit a laser beam responsive to receiving the laser control signal and in accordance with the laser control signal. The laser beam is either a pulsed-wave laser beam, a quasi-pulsed-wave laser beam, a continuous-wave laser beam, or a quasi-continuous-wave laser beam. The optical waveguide is configured to emit the laser beam from a second end of the optical waveguide after receiving the laser beam at a first end of the optical waveguide. The control circuitry is configured to receive a user request to operate in a requested mode, where the requested mode is either a pulsed-wave mode, a quasi-pulsed-wave mode, a continuous-wave mode, or a quasi-continuous-wave mode. The control circuitry is also configured to generate the laser control signal responsive to receiving the user request and in accordance with the requested mode.

A computer-implemented method for operation of a laser device with multi-modal capabilities includes receiving a user request to operate a laser device in a requested mode, where the requested mode is either a pulsed-wave mode, a quasi-pulsed-wave mode, a continuous-wave mode, or a quasi-continuous-wave mode. The method also includes, responsive to receiving the user request, causing a signal generator of the laser device to generate a laser control signal in accordance with the requested mode. The signal generator is configured to separately generate two or more of a pulsed-wave signal, a quasi-pulsed-wave signal, a continuous-wave signal, and a quasi-continuous-wave signal for transmission as a laser control signal. A laser source of the laser device is configured to receive the laser control signal and emit a laser beam responsive to receiving the laser control signal and in accordance with the laser control signal. The laser beam is either a pulsed-wave laser beam, a quasi-pulsed-wave laser beam, a continuous-wave laser beam, or a quasi-continuous-wave laser beam. Moreover, an optical waveguide is configured to emit the laser beam from a second end of the optical waveguide after receiving the laser beam at a first end of the optical waveguide.

A non-transitory, computer-readable medium stores instructions that, when executed by a processor of a laser device, cause the laser device to perform operations. The operations include receiving a user request to operate a laser device in a requested mode, where the requested mode is either a pulsed-wave mode, a quasi-pulsed-wave mode, a continuous-wave mode, or a quasi-continuous-wave mode. The operations also include, responsive to receiving the user request, causing a signal generator of the laser device to generate a laser control signal in accordance with the requested mode. The signal generator is configured to separately generate two or more of a pulsed-wave signal, a quasi-pulsed-wave signal, a continuous-wave signal, and a quasi-continuous-wave signal for transmission as a laser control signal. A laser source of the laser device is configured to receive the laser control signal and emit a laser beam responsive to receiving the laser control signal and in accordance with the laser control signal. The laser beam is either a pulsed-wave laser beam, a quasi-pulsed-wave laser beam, a continuous-wave laser beam, or a quasi-continuous-wave laser beam. Moreover, an optical waveguide is configured to emit the laser beam from a second end of the optical waveguide after receiving the laser beam at a first end of the optical waveguide.

A method of manufacturing a laser device includes providing a signal generator configured to separately generate two or more of a pulsed-wave signal, a quasi-pulsed-wave signal, a continuous-wave signal, and a quasi-continuous-wave signal for transmission as a laser control signal. The method also includes providing a laser source configured to receive the laser control signal and emit a laser beam responsive to receiving the laser control signal and in accordance with the laser control signal. The laser beam is either a pulsed-wave laser beam, a quasi-pulsed-wave laser beam, a continuous-wave laser beam, or a quasi-continuous-wave laser beam.

Additionally, the laser beam includes providing control circuitry. The control circuitry is configured to receive a user request to operate in a requested mode including either a pulsed-wave mode, a quasi-pulsed-wave mode, a continuous-wave mode, or a quasi-continuous-wave mode. The control circuitry is also configured to, responsive to receiving the user request, cause the signal generator to generate the laser control signal in accordance with the requested mode. Further, the method includes providing a housing for the signal generator, the laser source, and the control circuitry. Moreover, the method includes situating the signal generator, the laser source, and the control circuitry in the housing. Furthermore, the method includes connecting the control circuitry to the signal generator and the laser source. Also, an optical waveguide is configured to emit the laser beam from a second end of the optical waveguide after receiving the laser beam at a first end of the optical waveguide.

Other configurations of the subject technology will be apparent to those skilled in the art from the detailed description below, which describes various configurations of the subject technology and illustrations thereof. The subject technology is capable of other and different configurations, and its several details are capable of modification in various other respects, all without departing from the scope of the subject technology. Thus, the Drawings and Detailed Description are presented as illustrative in nature and should not be construed as restricting the present disclosure.

BRIEF DESCRIPTION OF THE DRAWINGS

For a better understanding of the present disclosure, reference should be made to the Detailed Description, below, in conjunction with the following drawings. Like reference numerals refer to corresponding parts throughout the figures and the description.

DETAILED DESCRIPTION

Figure 1A:
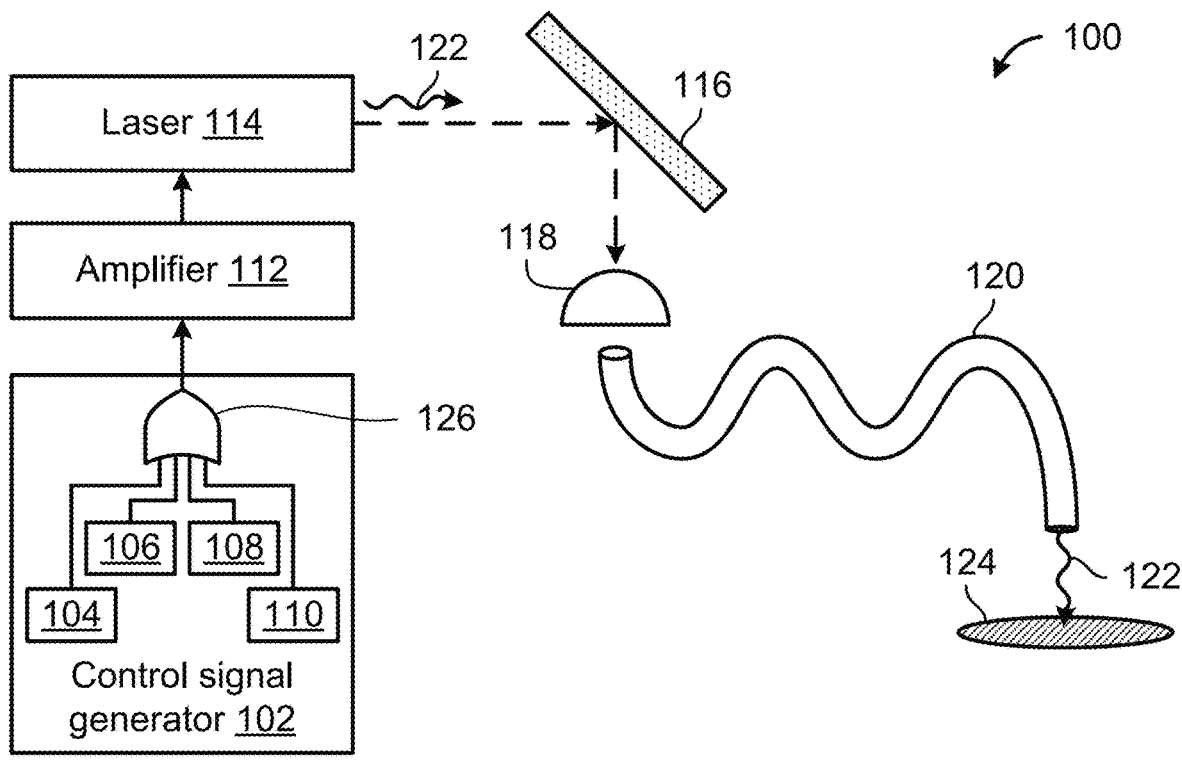
FIGS. 1A and 1B illustrate example components of laser devices, according to various aspects of the subject technology.
Figure 1B:
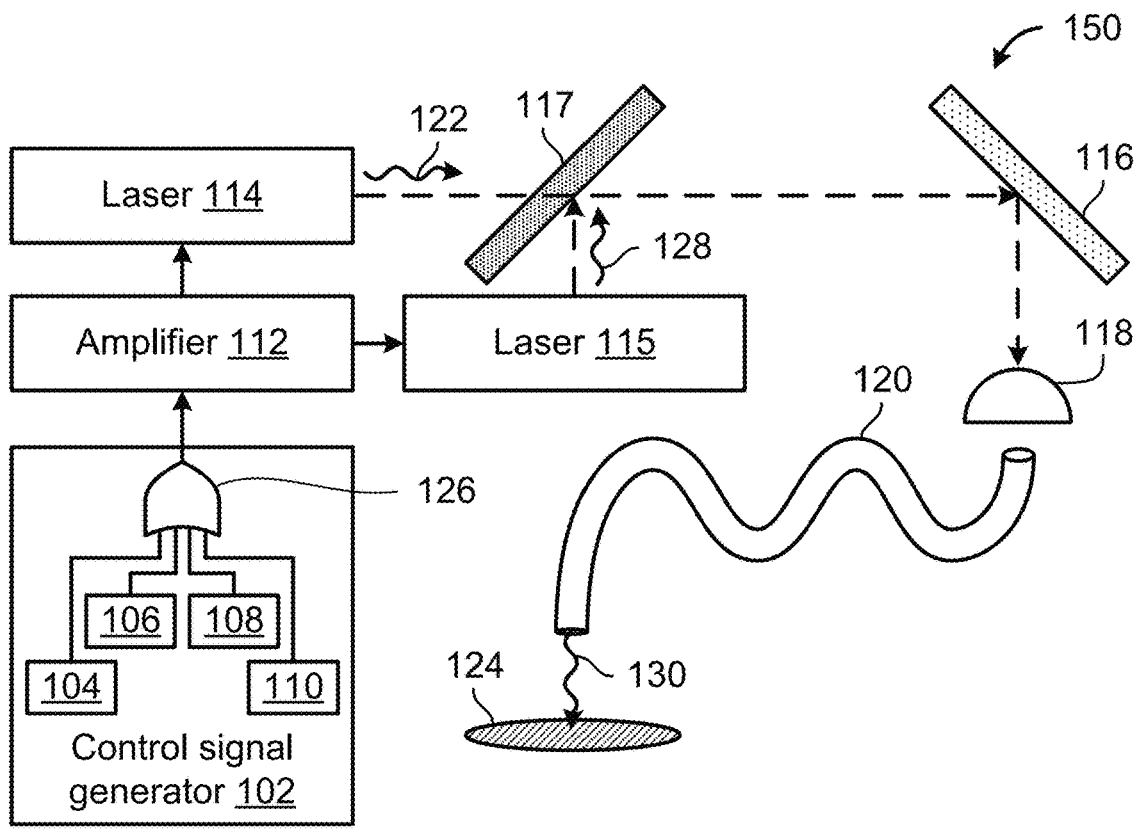
Figure 2A:
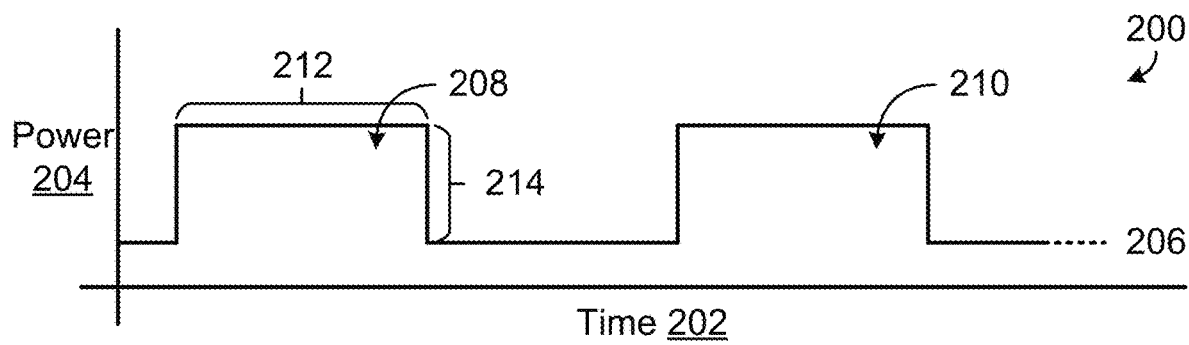
FIGS. 2A through 2D illustrate example laser beams emitted by a laser device, according to various aspects of the subject technology.
Figure 2B:
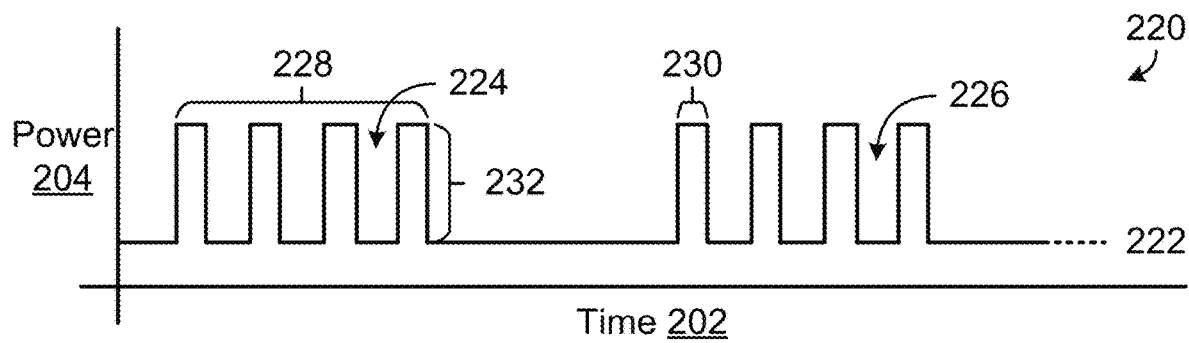
Figure 2C:
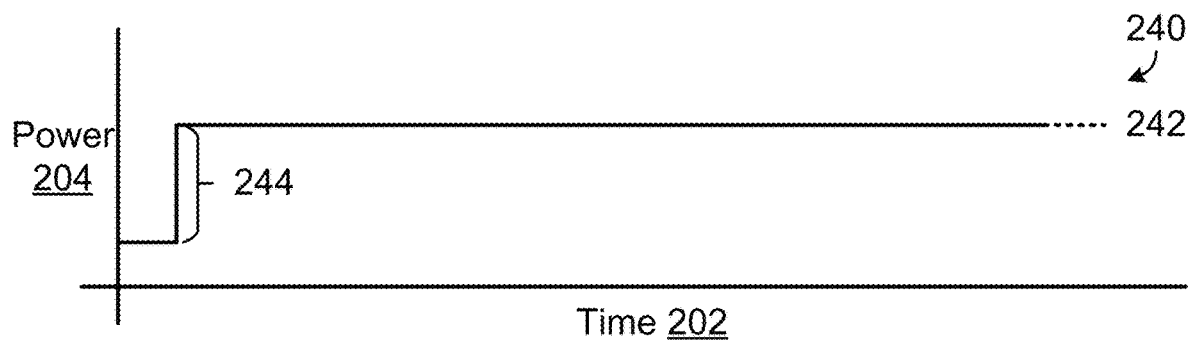
Figure 2D:
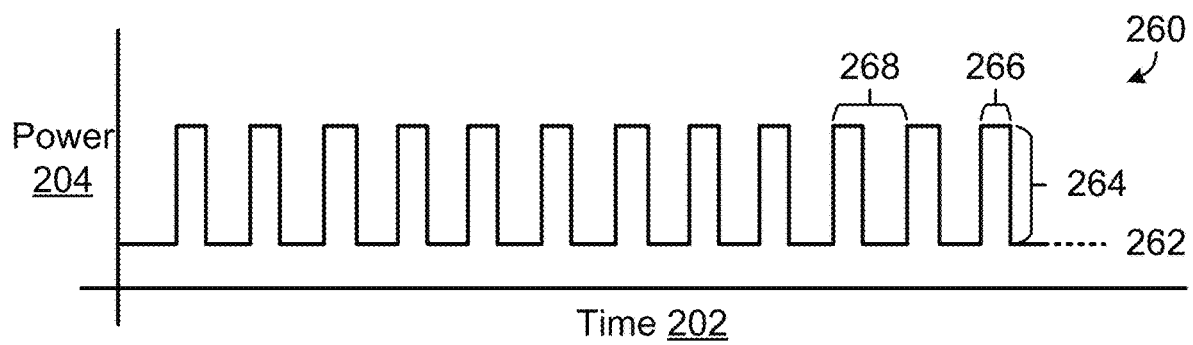

FIGS. 1A and 1B illustrate example components of laser devices 100 and 150, according to various aspects of the subject technology. Specifically, FIG. 1A illustrates a first laser device 100 configured to focus a laser beam 122 into a first end of an optical waveguide 120, whereafter the optical waveguide 120 emits the laser beam 122 towards a target area 124.

In the illustrated embodiment, the laser device 100 includes a control signal generator 102 with a pulsed-wave signal generator 104, a quasi-pulsed-wave signal generator 106, a continuous-wave signal generator 108, and a quasi-continuous-wave signal generator 110. In some embodiments, control signal generator 102 includes only two or three of the individual signal generators 104, 106, 108, and/or 110. Depending on the current operating mode of the laser device 100, the control signal generator 102 is configured to generate—for transmission as a laser control signal—a pulsed-wave signal using the pulsed-wave signal generator 104, a quasi-pulsed-wave signal using the quasi-pulsed-wave signal generator 106, a continuous-wave signal using the continuous-wave signal generator 108, or a quasi-continuous-wave signal using the quasi-continuous-wave signal generator 110. As illustrated, in some embodiments, the control signal generator 102 also includes logical circuitry 126 (e.g., an OR gate) for synthesizing signals generated by the various individual signal generators 104, 106, 108, and 110 into the laser control signal.

The laser device 100 also includes an amplifier 112 and a laser 114. These two components of the laser device 100 cooperate to receive the control signal from the laser control signal generator 102 and produce a laser beam 122 responsive to receiving the laser control signal and in accordance with the laser control signal. Specifically, the laser 114 is configured to emit a pulsed-wave laser beam if the laser control signal includes the pulsed-wave signal, a quasi-pulsed-wave laser beam for the quasi-pulsed-wave signal, a continuous-wave laser beam for the continuous-wave signal, or a quasi-continuous-wave laser beam for the quasi-continuous-wave signal.

Additionally, the laser device 100 includes a turning mirror 116 and a lens 118. The turning mirror 116 is configured to reflect the laser beam 122 and the lens 118 is configured to focus the laser beam 122. The turning mirror 116 is positioned relative to the laser 114, the lens 118, and a first end (i.e., nearest the lens 118) of the optical waveguide 120 such that the laser beam 122 is received at the first end of the optical waveguide 120 after the laser beam 122 is reflected off the turning mirror 116 and then focused by the lens 118. After the laser beam 122 is received at the first end of the optical waveguide 120, the laser beam 122 is emitted from the second end (i.e., furthest from the lens 118) of the optical waveguide 120 towards a target area 124, such as a surgical site.

The laser device 100 can be operated to achieve blood-vessel-absorption selectivity with the laser beam 122 having a wavelength of approximately 455 nanometers (e.g., +10 nm). This wavelength has sufficiently high hemoglobin and blood absorption, as well as sufficiently low wavelength absorption in untargeted tissue chromophores, such as water. Another advantage of the 455 nanometer wavelength is the relative transparency of water (i.e., low absorption), which allows laser irradiation to pass through water-rich tissue (e.g., mucosal layers) and be absorbed by hemoglobin-rich chromophores (e.g., below mucosal layers). In this manner, the laser device 100 can achieve selective heating of hemoglobin-rich areas while minimizing heating of intervening mucosa and other layers.

Additionally, the laser device 100 can be operated to achieve temporal selectivity with pulsed- or quasi-pulsed-wave modes. While operating in these modes, the pulse width of the laser beam 122 may range from approximately 200 microseconds (e.g., +10 µs) to approximately 200 milliseconds (e.g., +10 ms), with a power output of roughly 20 watt (e.g., +10 W) peak. These settings should be sufficient to raise the temperature of the target area 124 sufficiently for coagulation or involution while also providing requisite hemostasis. Where selective vessel coagulation or involution is delivered by means of pulse durations with thermal time constants less than that of the target area 124, the quasi-pulsed-wave mode may allow for selective targeting of small vessels even when the vessels are adjacent to or below other un-targeted vessels.

Further, in some embodiments, a robust cut and ablation capability is provided with a laser beam 122 having a wavelength of approximately 455 nanometers (e.g., +10 nm) and a power output of roughly 20 watts (e.g., +10 W) average. This laser beam 122 can be employed in a continuous- or quasi-continuous-wave mode, where the latter mode consists of a continuous stream of adjustable duration "micro-pulses" of approximately 200 microseconds (e.g., +10 µs) to approximately 20 milliseconds (e.g., +10 ms), with a duty cycle of approximately 10-90% (e.g., +2%). Pulse durations longer than the thermal time constant of the chromophore-containing tissue or structure can be used such that thermal diffusion from the 455 nanometer absorbing tissue region is intentionally conducted to nearby areas in order to facilitate optimum cutting or ablation.

Moreover, in some embodiments, the optical waveguide 120 is a fiber optic cable, thus providing flexibility in positioning the second end of the optical waveguide 120 with respect to the target area 124. The optical waveguide 120 may thus allow for use via the working channel of either flexible or fixed endoscopes, laryngoscopes, or other scopes, or directly via a handheld fiber. It is noted that the second end of the optical waveguide 120 may, in some embodiments, be coupled to a handpiece with internal focusing optics, via an empty handpiece channel, or via a cannula.

Furthermore, in some embodiments, the laser beam 122 has a wavelength of approximately 455 nanometers (e.g., +10 nm) and the aforenoted four modes are provided via diode laser drive electronics with an associated control means (e.g., control signal generator 102). The control means can provide pulse duration and pulse pattern timing, thus acting as a control input to the laser drive electronics. The control means may consist of firmware, hardware and software elements and may allow for user adjustment or fine tuning of laser operating parameters.

Turning now to FIG. 1B, the second laser device 150 also includes a control signal generator 102 with a pulsed-wave signal generator 104, a quasi-pulsed-wave signal generator 106, a continuous-wave signal generator 108, a quasi-continuous-wave signal generator 110, and logical circuitry 126. The second laser device 150 also includes an amplifier 112 and a laser 114, as well as a turning mirror 116 and a lens 118.

However, unlike the first laser device 100, the second laser device 150 includes a second laser 115 and a selective turning mirror 117. In cooperation with the amplifier 112, the second laser 115 is configured to receive the laser control signal from the control signal generator 102 and emit another laser beam 128 responsive to receiving the laser control signal and in accordance with the laser control signal. Similar to the first laser 114, the second laser 115 is configured to emit a pulsed-wave laser beam if the laser control signal includes the pulsed-wave signal, a quasi-pulsed-wave laser beam for the quasi-pulsed-wave signal, a continuous-wave laser beam for the continuous-wave signal, or a quasi-continuous-wave laser beam for the quasi-continuous-wave signal.

The selective turning mirror 117 is configured to reflect the second laser beam 128 but transmit the first laser beam 122. In the illustrated embodiment, the turning mirror 116 and the selective turning mirror 117 are positioned relative to the first laser 114, the lens 118, and the first end of the optical waveguide 120 such that the first laser beam 122 is received at the first end of the optical waveguide 120 after the first laser beam 122 is transmitted through the selective turning mirror 117, then reflected off the turning mirror 116, and finally focused by the lens 118. Additionally, in the illustrated embodiment, the turning mirror 116 and the selective turning mirror 117 are positioned relative to the second laser 115, the lens 118, and the first end of the optical waveguide 120 such that the second laser beam 128 is received at the first end of the optical waveguide 120 after the second laser beam 128 is reflected off the selective turning mirror 117, then reflected off the turning mirror 116, and finally focused by the lens 118.

After the first laser beam 122 is received at the first end of the optical waveguide 120, the first laser beam 122 is emitted from the second end of the optical waveguide 120 towards a target area 124, such as a surgical site. Likewise, after the second laser beam 128 is received at the first end of the optical waveguide 120, the second laser beam 128 is emitted from the second end of the optical waveguide towards the target area 124. In some embodiments, the first and second lasers 114-115 are configured to alternate operation such that the optical waveguide emits either the first laser beam 122 or the second laser beam 128. First and second lasers 114-115 may be selected to emit at different predetermined wavelengths. In some embodiments, first laser 114 is configured to emit a laser beam (first laser beam 122) having wavelength that is shorter than the laser beam (second laser beam 128) emitted by second laser 115. In some embodiments, first laser 114 is configured to emit at a wavelength in the visible light spectrum (e.g., 380 nm to 750 nm) while second laser 115 is configured to emit at a wavelength in the near-infrared spectrum (e.g., 750 nm to 3000 nm). In some embodiments, first laser 114 emits at a predetermined wavelength selected to treat a first tissue type (e.g., blood vessels or other soft tissue) and second laser 115 emits a predetermined wavelength selected to treat a second tissue type that is different than the first tissue type (e.g., bone). In some such embodiments, a single laser device 100 may be configured to treat a variety of different tissues.

In some embodiments, the first and second lasers 114-115 are configured to operate in rapid succession (e.g., within less than 10 ms of each other), such that the first laser 114 operates for a short amount of time (e.g., 10 ms), followed by operation of the second laser 115 for another short amount of time (e.g., 10 ms), again followed by the first laser 114, and so on. In some embodiments, when operating in rapid succession, the first laser beam 122 has a first wavelength of roughly 455 or 532 nanometers (e.g., +10 nm), and the second laser beam 128 has a second wavelength of roughly 1064 nanometers (e.g., +10 nm). The amount of time between operation of the first and second lasers 114-115 may range from 10 to 100 milliseconds depending, for instance, on the importance of delivering the first and second lasers in tight sequence with one another.

In some embodiments, the first and second lasers 114-115 are used independently of each other (e.g., using the same optical waveguide 120 but not within quick succession of each other). For example, the first laser 114 can be used for a first amount of time (e.g., 1 min) and the second laser can then be used for a second amount of time (e.g., 2 min). In some embodiments, the first laser 114 is configured to emit a laser beam 122 with a wavelength of approximately 455 nanometers (e.g., +20 nm) or approximately 532 nanometers (e.g., +30 nm) for blood vessels, cartilage, or soft tissue, while the second laser 115 is configured to emit a laser beam 128 with an erbium, near-infrared wavelength (e.g., 2,780±10 nm, 2,940±10 nm, or any other wavelength between 2,650-3,000 nm) for bone or tissues with hydroxyapatite. In this manner, the two lasers 114-115 can greatly expand the clinical applications of the present technology.

In some of these embodiments, the first laser 114 operates in a first operating mode including one of a pulsed-wave mode, a quasi-pulsed-wave mode, a continuous-wave mode, or a quasi-continuous-wave mode, and the second laser operates in a second operating mode including one of a pulsed-wave mode, a quasi-pulsed-wave mode, a continuous-wave mode, or a quasi-continuous-wave beam. In some embodiments, the first and second modes are different modes; however, in some embodiments, the first and second modes are the same mode. These modes can be selected by a user and may further improve the capacity of the laser device 100 for cutting, coagulating, or otherwise affecting tissue, bone, or other organic material (e.g., without the need for replacing the optical waveguide 120 for another optical waveguide).

In some embodiments, the optical waveguide 120 is a single hollow core waveguide suitable for $CO_2$ lasers having approximately 10,600 nanometer (e.g., +100 nm) wavelengths. In some of these embodiments, the first laser beam 122 has a wavelength of 455 or 532 nanometers (e.g., for soft tissue) and the second laser beam 128 has a wavelength of 10,600 nanometers (e.g., for bone), and the optical waveguide 120 is configured such that it can be used to deliver both of the laser beams 122 and 128 (e.g., in succession or simultaneously).

However, in some embodiments, the first and second lasers 114-115 operate concurrently such that both of the laser beams 122 and 128 are simultaneously received at the first end of the optical waveguide as a multiplexed laser beam 130. This multiplexed laser beam 130 is emitted from the second end of the optical waveguide 120 after being received at the first end thereof. In this manner, the second laser device 150 is able to operate in a variety of modes in addition to the four modes discussed above with respect to the first and second laser devices 100 and 150. In particular, the second laser device can further modulate its operation by selectively enabling its lasers 114-115.

In some instances, it is advantageous to apply more than one or a multiplicity of distinct wavelengths down the same optical fiber to the treated region. This may be beneficial for example when a first wavelength acts to heat a target for the purpose of altering the targets' absorption characteristics to more greatly absorb a second wavelength. This is particularly advantageous where the second wavelength may therefore penetrate more deeply into the targeted area 124.

One example of this includes 455 nanometers as a first wavelength (e.g., of the first laser 122), which acts to heat oxy-hemoglobin and thereby produce met-hemoglobin-so as to increase absorption of a second wavelength (e.g., of the second laser 128), such as 1064 nanometers. This combined, multiplexed laser beam 130 may coagulate blood vessels, which are deeper than could be otherwise coagulated. Or the multiplexed laser beam 130 may result in coagulation of blood vessels at shallower depths with reduced energy or laser power than would be otherwise possible. This multiwavelength approach is subject to many variations and many wavelength alternatives, although generally the first wavelength is selected to alter the targeted tissue or structures' chromophores to more readily absorb a second wavelength.

In order to ensure reliable predictable hemostasis, it may sometimes be necessary to first coagulate or involute very small vessels occupying a shallower depth over deeper and larger vessels and thereafter to coagulate or involute the deeper vessels with a longer pulse duration. The shallower smaller vessels being treated with shorter duration pulses in this example would be immediately followed by longer duration pulses sufficient to coagulate or involute the larger vessels.

Another method of coagulating various vessels at various depths may involve using a first wavelength and first pulse duration for shallower vessels immediately followed by a second wavelength with a second pulse duration. For example, the first wavelength and pulse duration could target shallow, small vessels by means of short pulse durations to confine damage to the targeted vessels. These short pulses may use a highly absorbed but shallow penetrating wavelength, such as 455 nanometers. The second wavelength and longer pulse duration, then, could coagulate or involute deeper vessels or structures by means of longer pulse durations with a deeper penetrating wavelength, such as 1064 nanometers. Likewise, larger shallow vessels would only require a longer pulse duration of, for example, 455 nanometers and where smaller and deeper vessels may be targeted by means of shorter duration pulse of 1064 nanometers.

This approach is not restricted to targeting blood vessels. In some embodiments, the approach is used for other biological targets, with wavelengths selected on the basis of one or more of penetration depth or the absorption by native chromophores within or upon the desired targets. In some cases, artificial or externally derived dyes may be applied to desired targets to boost laser absorption and thereby extend the targetable depth or reduce the laser energy or power required to effectively treat the desired target.

FIGS. 2A through 2D illustrate example laser beams 206, 222, 242, and 262 emitted by a laser device (e.g., laser device 100 or 150), according to various aspects of the subject technology. Each of the laser beams 206, 222, 242, and 262 is illustrated on a graph chart 200, 220, 240, or 260 with respective x- and y-axes 202 and 204 corresponding, respectively, to time and the power output of the laser beam.

The first laser beam 206 is a pulsed-wave laser beam characterized by pulses 208 and 210, each of which has a width 212 and an amplitude 214. The second laser beam 222 is a quasi-pulsed-wave laser beam characterized by pulses 224 and 226, each of which has a width 228 and an amplitude 232. Unlike the pulses 208 and 210 of the first laser beam 206, however, the pulses 224 and 226 of the second laser beam 222 involve oscillations with respective sub-widths 230. The third laser beam 242 is a continuous-wave laser beam characterized by a continuous pulse with an amplitude 244. Finally, the fourth laser beam 262 is a quasi-continuous-wave laser beam characterized by an oscillating pulse with an amplitude 264 and a wavelength 268 and a sub-width 266 for each individual oscillation.

Figure 3:
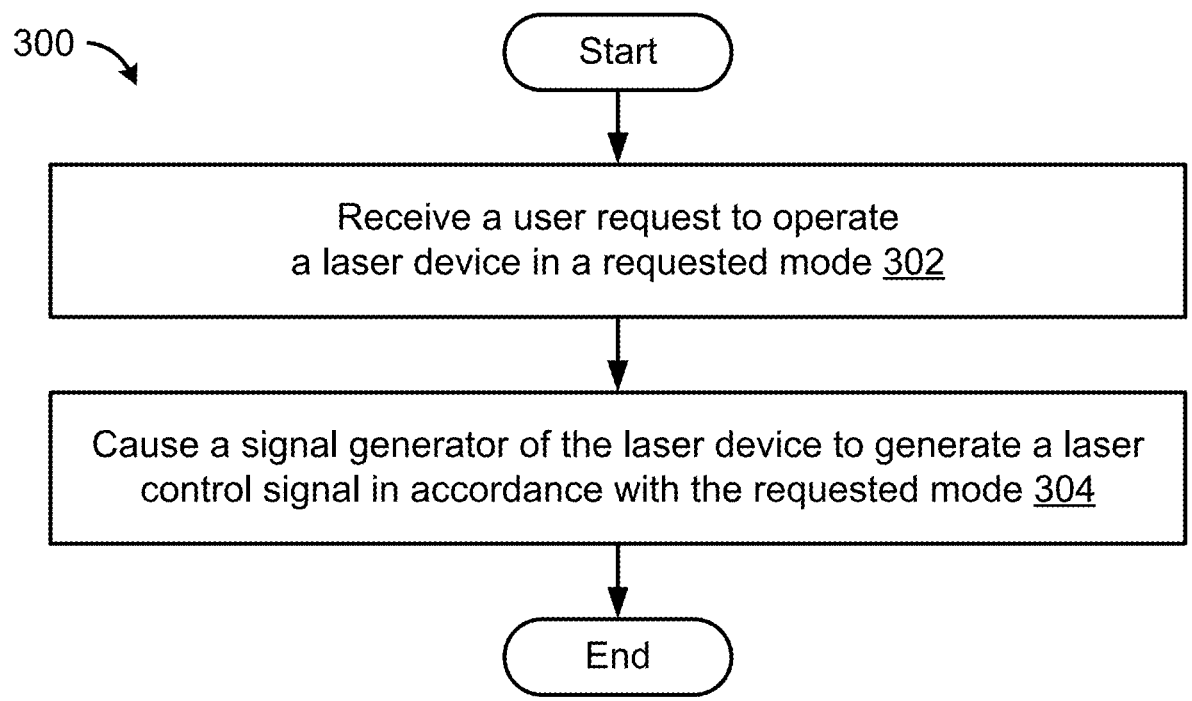
FIG. 3 illustrates an example process for operation of a laser device configured to operate in multiple different modes, according to various aspects of the subject technology.

FIG. 3 illustrates an example process 300 for operation of a laser device (e.g., laser device 100 or laser device 150) configured to operate in multiple different modes, according to various aspects of the subject technology. The operations of process 300 can be carried out by hardware, such as that discussed above with respect to FIGS. 1A through 2D, including the control signal generator 102 of FIGS. 1A and 1B. Additionally, the process 300 can also be executed by a processor configured to execute instructions stored in a non-transitory, computer-readable medium.

In the illustrated embodiment, the process 300 includes receiving (302) a user request to operate a laser device (e.g., laser device 100 or 150) in a requested mode, where the requested mode is either a pulsed-wave mode, a quasi-pulsed-wave mode, a continuous-wave mode, or a quasi-continuous-wave mode.

The process also includes causing (304) a signal generator (e.g., control signal generator 102) of the laser device to generate a laser control signal in accordance with the requested mode. The signal generator is configured to separately generate two or more of a pulsed-wave signal (e.g., using pulsed-wave signal generator 104), a quasi-pulsed-wave signal (e.g., using quasi-pulsed-wave signal generator 106), a continuous-wave signal (e.g., using continuous-wave signal generator 108), and a quasi-continuous-wave signal (e.g., using quasi-continuous-wave signal generator 110) for transmission as a laser control signal.

The laser control signal is transmitted to a laser source (e.g., laser 114) of the laser device. The laser source is configured to receive the laser control signal and emit a laser beam (e.g., laser beam 122) responsive to receiving the laser control signal and in accordance with the laser control signal. The laser beam is either a pulsed-wave laser beam (e.g., pulsed-wave laser beam 206), a quasi-pulsed-wave laser beam (e.g., quasi-pulsed-wave laser beam 222), a continuous-wave laser beam (e.g., continuous-wave laser beam 242), or a quasi-continuous-wave laser beam (e.g., quasi-continuous-wave laser beam 262). Additionally, an optical waveguide (e.g., optical waveguide 120) is configured to emit the laser beam from a second end of the optical waveguide (e.g., furthest from lens 118) after receiving the laser beam at a first end of the optical waveguide (e.g., nearest lens 118).

In some embodiments, the method further includes, after causing the signal generator to generate the laser control signal in accordance with the requested mode receiving another user request to operate in another requested mode and, responsive to receiving the other user request, causing the signal generator to generate the laser control signal in accordance with the other requested mode. Like the aforenoted requested mode, the other requested mode is either the pulsed-wave mode, the quasi-pulsed-wave mode, the continuous-wave mode, or the quasi-continuous-wave mode. The other laser control signal is transmitted to the laser source.

In some embodiments, the laser device further includes another laser source (e.g., laser 115) configured to receive the laser control signal and emit another laser beam (e.g., laser beam 128) responsive to receiving the laser control signal and in accordance with the laser control signal. Like the aforenoted laser beam, the other laser beam is either a pulsed-wave laser beam, a quasi-pulsed-wave laser beam, a continuous-wave laser beam, or a quasi-continuous-wave laser beam. The optical waveguide is further configured to emit a multiplexed laser beam (e.g., multiplexed laser beam 130) from the second end of the optical waveguide responsive to receiving the multiplexed laser beam at the first end of the optical waveguide. The multiplexed laser beam includes the laser beam and the other laser beam.

In some embodiments, the laser device further includes a selective turning mirror (e.g., selective turning mirror 117) and a turning mirror (e.g., turning mirror 116). The selective turning mirror is configured to transmit the laser beam and reflect the other laser beam. Additionally, the turning mirror is configured to reflect the laser beam and reflect the other laser beam. Further, the selective turning mirror and the turning mirror are positioned relative to the laser source, the other laser source, and the first end of the optical waveguide such that the laser beam is received at the first end of the optical waveguide after the laser beam is transmitted through the selective turning mirror and then reflected off the turning mirror, the other laser beam is received at the first end of the optical waveguide after the laser beam is reflected off the selective turning mirror and then reflected off the turning mirror, and the laser beam and the other laser beam are concurrently received at the first end of the optical waveguide as the multiplexed laser beam.

In some embodiments, the laser device further includes a focusing lens (e.g., lens 118) configured to focus the multiplexed laser beam. The focusing lens is positioned relative to the first end of the optical waveguide such that the multiplexed laser beam is focused by the focusing lens before the multiplexed laser beam is received at the first end of the optical waveguide.

In some embodiments, while the laser source and/or the other laser source is operating in a mode where the laser beam and/or the other laser beam has a wavelength (e.g., quasi-continuous-wave mode), the laser beam has a wavelength between 450-460 nanometers and/or the other laser beam has a wavelength between 1060-1070 nanometers.

In some embodiments, while the laser source and/or the other laser source is operating in a mode where the laser beam and/or the other laser beam has a pulse duration (e.g., pulsed-wave mode, quasi-pulsed-wave mode), the laser beam has a pulse duration between 500-50,000 microseconds and/or the other laser beam has a pulse duration between 500-50,000 microseconds.

In some embodiments, the laser beam has a power output between 10-30 watts and/or the other laser beam has a power output between 10-80 watts.

In some embodiments, the laser device further includes a radiofrequency identification (RFID) reader configured to read from and write to an RFID tag embedded within the optical waveguide, where the RFID tag includes a unique identifier associated with the optical waveguide. Additionally, the method further includes causing the RFID reader to read the unique identifier from the RFID tag. Further, the method includes identifying the optical waveguide based on the unique identifier. Moreover, the method includes writing a use identifier to the RFID tag, wherein the use identifier indicates that the optical waveguide has been used in a surgical procedure.

In some embodiments, the laser device includes an RFID-based means for reading and writing to optical waveguides with an RFID tag such that the optical waveguide, once used, is thereafter disabled to prevent reuse. For example, the method may further include causing the RFID reader to read the use identifier from the RFID tag, determining that the optical waveguide has been used in a surgical procedure based on the use identifier, and rejecting the optical waveguide responsive to determining that the optical waveguide has been used in a surgical procedure.

Technical Consideration. Laser wavelength selectivity: Laser irradiation must be absorbed to drive accumulation of thermal energy or a temperature rise in a target. Selective heating of a target requires selective absorption of laser irradiation by a chromophore present in the target but not present or present at reduced density in untargeted areas adjacent to the target such that thermal energy accumulates in the target during the applied irradiation and where heating of surrounding or adjacent areas is limited by thermal diffusion time constants from the targeted tissues to adjacent untargeted tissues.

Carbon dioxide ($CO_2$) lasers are preferentially absorbed by water and therefore provide tissue cutting and or ablation in biologic tissues with predictable hemostasis. $CO_2$ radiation must be delivered to the target tissue via either direct line of sight or via an appropriate hollow waveguide since $CO_2$ wavelengths will not propagate down a standard silica optical fiber. Due to the high absorption in water within biological tissues, $CO_2$ wavelengths therefore offer almost no selectivity of absorption between tissues. This relative lack of $CO_2$ wavelength selectivity of absorption between different tissues works well for cutting and ablation functions whereas selective coagulation of a target requires a wavelength selectively absorbed by that target and not absorbed by the adjacent untargeted tissues.

Selective coagulation of for example blood vessels requires a wavelength absorbed by a chromophore in the target vessels and which is not present (or is present at reduced density) in untargeted adjacent tissues such that targeted vessels preferentially absorb the wavelength and where adjacent tissues do not. Thus, the capability required to selectively heat and coagulate blood vessels while protecting adjacent untargeted tissues requires a wavelength other than $CO_2$.

Pulsed mode or temporal laser selectivity: In order to confine absorbed laser radiation driven temperature rise within a target or targeted structure, it is important to deliver the laser radiation within the thermal relaxation time of the targeted tissue. Thermal relaxation time for a target can be defined as the time for a target to dissipate a percentage, for example 63%, of the thermal energy deposited by the laser irradiation.

Target selectivity wherein thermal energy absorbed by the target is more or less selectively absorbed by the target and that energy delivered within the targets' thermal relaxation time results in a temperature rise largely confined to the target thus selectively damaging or destroying the target while largely avoiding damage due to dissipation of the targets' accumulated thermal energy through thermal diffusion into areas or tissues nearby or adjacent to the target. Thus, smaller targets require shorter duration laser pulses to provide selective heating of the target whereas effective cutting or ablation of tissues requires longer duration exposures.

Thus, in cutting or ablation applications, absorption of irradiation in a selected target chromophore relies on thermal diffusion to heat adjacent or surrounding tissue lacking absorptive chromophores relative to the applied wavelength and thermal diffusion takes time irrespective of laser pulse duration. Therefore, laser irradiation intervals or pulse durations longer than those used for selective coagulation and longer than the thermal time constant of the Tissues or structures in the targeted area are used to perform cuts or ablation of targets.

Additionally, when considering laser cutting or ablation of tissue the use of a wavelength with generally uniform absorption in all areas of the intended cut is most common, for example $CO_2$ laser wavelengths with strong absorption in water will drive a temperature rise in all water containing tissues. Thus, tissue cutting or ablation is driven by direct absorption of the $CO_2$ laser irradiation beam which causes a temperature rise sufficient to cut or ablate tissue in all water containing tissues within the irradiated region.

When considering a more selective wavelength lacking a generally uniform absorption in all areas of the intended cutting or ablation region both direct absorption and thermal diffusion act to increase temperatures throughout the area of the intended cut. In this case pulse durations and inter pulse delays may be selected to tune or select the proportion of heating which is accomplished by direct laser absorption and that which is accomplished by thermal diffusion. Thus, shorter pulse durations tend toward confinement of heating to the directly absorbing regions and longer pulse durations allow the conduction of heating via thermal diffusion to areas adjacent the directly absorbing regions.

Pulse durations which are shorter than the time constant of the chromophore containing tissue or structures within the cut or ablation targeted region will substantially confine heating to the chromophore containing region or structure and where thermal diffusion and corresponding temperature rise of adjacent areas is reduced. For this reason, longer or even CW pulse durations are essential to perform cutting or ablation with a laser wavelength which is only selectively absorbed by portions of the targeted areas and where some portions of that area contain no or relatively few chromophores for the given wavelength to be absorbed by.

When applying a wavelength lacking a generally uniform absorption in all areas of the intended cutting or ablation region, selection of pulse duration may be adjusted to increase or decrease thermal diffusion into adjacent areas thereby increasing or decreasing the cut or ablation depth and or width.

To perform effective cuts of tissues including constituents of which contain absorptive chromophores and constituents or adjacent areas which lack selectively absorbed chromophores of the applied wavelength, laser pulse durations deliberately greater than the time constant of the chromophore containing target may be used to enhance thermal diffusion into desired area near the chromophore containing target. Thus, laser irradiation, rather than confining temperature rise to the absorptive target by means of short pulse durations, instead relies on longer pulse durations to enhance thermal diffusion from absorptive tissue area or targets into adjacent or nearby tissue areas to cut or ablate them. Cut and or ablation depth and width can therefore be tuned by selection of pulse duration.

For a given fixed average power, longer pulse duration or continuous-wave emissions maximize cut depth and width and shorter pulse durations or continuous pulse trains consisting of shorter pulse durations with an inter-pulse delay (quasi-continuous wave) may be used to reduce cut depth and width while at the same average power as in continuous-wave emission mode. In some embodiments, continuous-wave mode is particularly useful for large bulky excisions with predictable hemostasis whereas quasi-continuous-wave mode is adjustable to confer more shallow, more confined cuts or ablations-thereby protecting adjacent tissues from undesired laser irradiation.

Generally, the goal in laser surgeries is to confine damage to chromophore-rich tissue. However, sometimes lasers are used to damage adjacent tissue structures and not just the targeted, chromophore-rich tissue. For example, fat cells and liposomes are damages at lower temperatures than fibrous tissue, such as septac which are present throughout fatty or liposome-rich regions of the body. In this case, the septac could be targeted with a given wavelength (e.g., 455 nm) and heated for a long duration at relatively low power such that the septac absorb the wavelength and thermally diffuse to adjacent liposome tissue.

Additionally, cancer tumors are commonly chaotically vascularized with dense concentrations of blood vessels. By using a selective wavelength (e.g., 455 nm, 532 nm), long-duration pulses or continuous-waves could gradually heat vessels so as to promote or maximize thermal diffusion from vessels into adjacent tumor areas. In this manner, thermal diffusion can be used for damaging or lysing areas between vessels, whereafter laser power can be increased and/or pulse durations decreased so as to directly target the vessels within the targeted tumor. Cancer tumors can thereby be targeted by first using thermal diffusion from the laser being absorbed into vessel chromophores and then by more rapid heating of vessels within the tumor to directly coagulate them via laser absorption.

Quasi-continuous-wave cutting depth control (depth reduction) is conferred by a stream of pulses of various duty cycles such that small areas are irradiated with 0.5 ms to 5 ms duration micro-pulses and where thermal diffusion of the resulting temperature increase into adjacent areas is controlled by adjustment of the cooling period between micro-pulses (inter-pulse delay) and the rate of motion of the fiber optic tip over or across the tissue.

One advantage of cut or ablation adjustability is in delicate microsurgeries or in neurosurgical applications or any surgical application dependent on preventing thermal diffusion driven damage to adjacent tissue areas. 455 nm is strongly absorbed by hemoglobin and thus may be advantageous for coagulation during cutting or ablating functions according to certain embodiments. Sufficiently high 455 nm peak power is required to provide hemostasis whereas control or reduction of cut and or ablation depth as well as limitation of thermal damage to adjacent sensitive tissue areas is accomplished by reduction in pulse duration which thereby reduces time available for thermal diffusion into untargeted nearby tissue areas. Pulse duration controls the apportionment of the amount of heating due to direct laser absorption vs. that of thermal diffusion wherein shorter pulse durations confine temperature increases to directly absorbed chromophore containing tissue regions and where longer pulse durations allow more time for thermal diffusion driven temperature increase to areas adjacent to the directly absorbed tissue regions. Thus, to deliberately increase thermal diffusion to adjacent untargeted or poorly absorbing nearby tissue areas, longer duration pulses at reduced power levels are applied. Whereas to reduce thermal diffusion and confine temperature increases to the directly absorbing tissue regions shorter duration but higher power pulses are used.

Illustrative Clauses. For further reference, example aspects of the present disclosure are included below as numbered clauses. These clauses are provided for illustrative purposes and are not intended to limit the subject technology.

Clause 1. A laser device comprising: a signal generator configured to separately generate (i) a pulsed-wave signal, (ii) a quasi-pulsed-wave signal, (iii) a continuous-wave signal, or (iv) a quasi-continuous-wave signal for transmission as a laser control signal; a laser source configured to receive the laser control signal and emit a laser beam responsive to receiving the laser control signal and in accordance with the laser control signal, wherein the laser beam comprises (i) a pulsed-wave laser beam, (ii) a quasi-pulsed-wave laser beam, (iii) a continuous-wave laser beam, or (iv) a quasi-continuous-wave laser beam; another laser source configured to receive the laser control signal and emit another laser beam responsive to receiving the laser control signal and in accordance with the laser control signal, wherein the other laser beam comprises (i) a pulsed-wave laser beam, (ii) a quasi-pulsed-wave laser beam, (iii) a continuous-wave laser beam, or (iv) a quasi-continuous-wave laser beam; a selective turning mirror configured to transmit the laser beam and reflect the other laser beam; and a turning mirror configured to reflect the laser beam and reflect the other laser beam; and control circuitry configured to: receive a user request to operate in a requested mode comprising (i) a pulsed-wave mode, (ii) a quasi-pulsed-wave mode, (iii) a continuous-wave mode, or (iv) a quasi-continuous-wave mode; and responsive to receiving the user request, cause the signal generator to generate the laser control signal in accordance with the requested mode; wherein the selective turning mirror and the turning mirror are positioned relative to the laser source, the other laser source, and a first end of an optical waveguide such that (i) the laser beam is received at the first end of the optical waveguide after the laser beam is transmitted through the selective turning mirror and then reflected off the turning mirror, (ii) the other laser beam is received at the first end of the optical waveguide after the laser beam is reflected off the selective turning mirror and then reflected off the turning mirror, and (iii) the laser beam and the other laser beam are concurrently received at the first end of the optical waveguide as a multiplexed laser beam comprising the laser beam and the other laser beam; and wherein the optical waveguide is configured to emit the multiplexed laser beam from a second end of the optical waveguide responsive to receiving the multiplexed laser beam at the first end of the optical waveguide.

Clause 2. A laser device comprising: a signal generator configured to separately generate two or more of (i) a pulsed-wave signal, (ii) a quasi-pulsed-wave signal, (iii) a continuous-wave signal, and (iv) a quasi-continuous-wave signal for transmission as a laser control signal; a laser source configured to receive the laser control signal and emit a laser beam responsive to receiving the laser control signal and in accordance with the laser control signal, wherein the laser beam comprises either (i) a pulsed-wave laser beam, (ii) a quasi-pulsed-wave laser beam, (iii) a continuous-wave laser beam, or (iv) a quasi-continuous-wave laser beam; and control circuitry configured to: receive a user request to operate in a requested mode comprising either (i) a pulsed-wave mode, (ii) a quasi-pulsed-wave mode, (iii) a continuous-wave mode, or (iv) a quasi-continuous-wave mode;

responsive to receiving the user request, cause the signal generator to generate the laser control signal in accordance with the requested mode; and wherein an optical waveguide is configured to emit the laser beam from a second end of the optical waveguide after receiving the laser beam at a first end of the optical waveguide.

Clause 3. The laser device of either Clause 1 or 2, wherein the control circuitry is further configured to, after causing the signal generator to generate the laser control signal in accordance with the requested mode: receive another user request to operate in another requested mode comprising either (i) the pulsed-wave mode, (ii) the quasi-pulsed-wave mode, (iii) the continuous-wave mode, or (iv) the quasi-continuous-wave mode; and responsive to receiving the other user request, cause the signal generator to generate the laser control signal in accordance with the other requested mode.

Clause 4. The laser device of either Clause 2 or 3, further comprising: another laser source configured to receive the laser control signal and emit another laser beam responsive to receiving the laser control signal and in accordance with the laser control signal, wherein the other laser beam comprises either (i) a pulsed-wave laser beam, (ii) a quasi-pulsed-wave laser beam, (iii) a continuous-wave laser beam, or (iv) a quasi-continuous-wave laser beam; wherein the optical waveguide is further configured to emit a multiplexed laser beam from the second end of the optical waveguide responsive to receiving the multiplexed laser beam at the first end of the optical waveguide, the multiplexed laser beam comprising the laser beam and the other laser beam.

Clause 5. The laser device of Clause 4, further comprising: a selective turning mirror configured to transmit the laser beam and reflect the other laser beam; and a turning mirror configured to reflect the laser beam and reflect the other laser beam; wherein the selective turning mirror and the turning mirror are positioned relative to the laser source, the other laser source, and the first end of the optical waveguide such that (i) the laser beam is received at the first end of the optical waveguide after the laser beam is transmitted through the selective turning mirror and then reflected off the turning mirror, (ii) the other laser beam is received at the first end of the optical waveguide after the laser beam is reflected off the selective turning mirror and then reflected off the turning mirror, and (iii) the laser beam and the other laser beam are concurrently received at the first end of the optical waveguide as the multiplexed laser beam.

Clause 6. The laser device of any one of Clauses 1, 4, or 5, further comprising: a focusing lens configured to focus the multiplexed laser beam; wherein the focusing lens is positioned relative to the first end of the optical waveguide such that the multiplexed laser beam is focused by the focusing lens before the multiplexed laser beam is received at the first end of the optical waveguide.

Clause 7. The laser device of any one of Clauses 1 and 4 through 6, wherein: the laser beam has a wavelength between 450-460 nanometers while the laser source is operating in the quasi-continuous-wave mode; and/or the other laser beam has a wavelength between 1060-1070 nanometers while the other laser source is operating in the quasi-continuous-wave mode.

Clause 8. The laser device of any one of Clauses 1 and 4 through 7, wherein: the laser beam has a pulse duration between 500-50,000 microseconds while the laser source is operating in the pulsed-wave mode or the quasi-pulsed-wave mode; and the other laser beam has a pulse duration between 500-50,000 microseconds while the other laser source is operating in the pulsed-wave mode or the quasi-pulsed-wave mode.

Clause 9. The laser device of any one of Clauses 1 and 4 through 8, wherein: the laser beam has a power output between 10-30 watts; and the other laser beam has a power output between 10-80 watts.

Clause 10. The laser device of any one of Clauses 1 through 9, further comprising: an RFID reader configured to read from and write to an RFID tag embedded within the optical waveguide, wherein the RFID tag comprises a unique identifier associated with the optical waveguide; wherein the control circuitry is further configured to: cause the RFID reader to read the unique identifier from the RFID tag; identify the optical waveguide based on the unique identifier; and write a use identifier to the RFID tag, wherein the use identifier indicates that the optical waveguide has been used in a surgical procedure.

Clause 11. The laser device of Clause 10, wherein the control circuitry is further configured to: cause the RFID reader to read the use identifier from the RFID tag; determine that the optical waveguide has been used in a surgical procedure based on the use identifier; and reject the optical waveguide responsive to determining that the optical waveguide has been used in a surgical procedure.

Clause 12. A laser system comprising: a signal generator configured to separately generate two or more of (i) a pulsed-wave signal, (ii) a quasi-pulsed-wave signal, (iii) a continuous-wave signal, and (iv) a quasi-continuous-wave signal for transmission as a laser control signal; a laser source configured to receive the laser control signal and emit a laser beam responsive to receiving the laser control signal and in accordance with the laser control signal, wherein the laser beam comprises either (i) a pulsed-wave laser beam, (ii) a quasi-pulsed-wave laser beam, (iii) a continuous-wave laser beam, or (iv) a quasi-continuous-wave laser beam; an optical waveguide configured to emit the laser beam from a second end of the optical waveguide after receiving the laser beam at a first end of the optical waveguide; and control circuitry configured to: receive a user request to operate in a requested mode comprising either (i) a pulsed-wave mode, (ii) a quasi-pulsed-wave mode, (iii) a continuous-wave mode, or (iv) a quasi-continuous-wave mode; responsive to receiving the user request, cause the signal generator to generate the laser control signal in accordance with the requested mode.

Clause 13. The laser system of Clause 12, wherein the control circuitry is further configured to, after causing the signal generator to generate the laser control signal in accordance with the requested mode: receive another user request to operate in another requested mode comprising either (i) the pulsed-wave mode, (ii) the quasi-pulsed-wave mode, (iii) the continuous-wave mode, or (iv) the quasi-continuous-wave mode; and responsive to receiving the other user request, cause the signal generator to generate the laser control signal in accordance with the other requested mode.

Clause 14. The laser system of either Clause 12 or 13, further comprising: another laser source configured to receive the laser control signal and emit another laser beam responsive to receiving the laser control signal and in accordance with the laser control signal, wherein the other laser beam comprises either (i) a pulsed-wave laser beam, (ii) a quasi-pulsed-wave laser beam, (iii) a continuous-wave laser beam, or (iv) a quasi-continuous-wave laser beam; wherein the optical waveguide is further configured to emit a multiplexed laser beam from the second end of the optical waveguide responsive to receiving the multiplexed laser beam at the first end of the optical waveguide, the multiplexed laser beam comprising the laser beam and the other laser beam.

Clause 15. The laser system of Clause 14, further comprising: a selective turning mirror configured to transmit the laser beam and reflect the other laser beam; and a turning mirror configured to reflect the laser beam and reflect the other laser beam; wherein the selective turning mirror and the turning mirror are positioned relative to the laser source, the other laser source, and the first end of the optical waveguide such that (i) the laser beam is received at the first end of the optical waveguide after the laser beam is transmitted through the selective turning mirror and then reflected off the turning mirror, (ii) the other laser beam is received at the first end of the optical waveguide after the laser beam is reflected off the selective turning mirror and then reflected off the turning mirror, and (iii) the laser beam and the other laser beam are concurrently received at the first end of the optical waveguide as the multiplexed laser beam.

Clause 16. The laser system of either Clause 14 or 15, further comprising: a focusing lens configured to focus the multiplexed laser beam; wherein the focusing lens is positioned relative to the first end of the optical waveguide such that the multiplexed laser beam is focused by the focusing lens before the multiplexed laser beam is received at the first end of the optical waveguide.

Clause 17. The laser system of any one of Clauses 14 through 16, wherein: the laser beam has a wavelength between 450-460 nanometers while the laser source is operating in the quasi-continuous-wave mode; and/or the other laser beam has a wavelength between 1060-1070 nanometers while the other laser source is operating in the quasi-continuous-wave mode.

Clause 18. The laser system of any one of Clauses 14 through 17, wherein: the laser beam has a pulse duration between 500-50,000 microseconds while the laser source is operating in the pulsed-wave mode or the quasi-pulsed-wave mode; and the other laser beam has a pulse duration between 500-50,000 microseconds while the other laser source is operating in the pulsed-wave mode or the quasi-pulsed-wave mode.

Clause 19. The laser system of any one of Clauses 14 through 18, wherein: the laser beam has a power output between 10-30 watts; and the other laser beam has a power output between 10-80 watts.

Clause 20. The laser system of any one of Clauses 12 through 19, further comprising: an RFID reader configured to read from and write to an RFID tag embedded within the optical waveguide, wherein the RFID tag comprises a unique identifier associated with the optical waveguide; wherein the control circuitry is further configured to: cause the RFID reader to read the unique identifier from the RFID tag; identify the optical waveguide based on the unique identifier; and write a use identifier to the RFID tag, wherein the use identifier indicates that the optical waveguide has been used in a surgical procedure.

Clause 21. The laser system of Clause 20, wherein the control circuitry is further configured to: cause the RFID reader to read the use identifier from the RFID tag; determine that the optical waveguide has been used in a surgical procedure based on the use identifier; and reject the optical waveguide responsive to determining that the optical waveguide has been used in a surgical procedure.

Clause 22. A computer-implemented method for operation of a laser device with multi-mode capabilities, the method comprising: receiving a user request to operate a laser device in a requested mode comprising either (i) a pulsed-wave mode, (ii) a quasi-pulsed-wave mode, (iii) a continuous-wave mode, or (iv) a quasi-continuous-wave mode; responsive to receiving the user request, causing a signal generator of the laser device to generate a laser control signal in accordance with the requested mode; wherein the signal generator is configured to separately generate two or more of (i) a pulsed-wave signal, (ii) a quasi-pulsed-wave signal, (iii) a continuous-wave signal, and (iv) a quasi-continuous-wave signal for transmission as a laser control signal; wherein the laser device further comprises a laser source configured to receive the laser control signal and emit a laser beam responsive to receiving the laser control signal and in accordance with the laser control signal, wherein the laser beam comprises either (i) a pulsed-wave laser beam, (ii) a quasi-pulsed-wave laser beam, (iii) a continuous-wave laser beam, or (iv) a quasi-continuous-wave laser beam; and wherein an optical waveguide is configured to emit the laser beam from a second end of the optical waveguide after receiving the laser beam at a first end of the optical waveguide.

Clause 23. The computer-implemented method of Clause 22, further comprising, after causing the signal generator to generate the laser control signal in accordance with the requested mode: receiving another user request to operate in another requested mode comprising either (i) the pulsed-wave mode, (ii) the quasi-pulsed-wave mode, (iii) the continuous-wave mode, or (iv) the quasi-continuous-wave mode; and responsive to receiving the other user request, causing the signal generator to generate the laser control signal in accordance with the other requested mode.

Clause 24. The computer-implemented method of either Clause 22 or 23, wherein: the laser device further comprises another laser source configured to receive the laser control signal and emit another laser beam responsive to receiving the laser control signal and in accordance with the laser control signal, the other laser beam comprising either (i) a pulsed-wave laser beam, (ii) a quasi-pulsed-wave laser beam, (iii) a continuous-wave laser beam, or (iv) a quasi-continuous-wave laser beam; and the optical waveguide is further configured to emit a multiplexed laser beam from the second end of the optical waveguide responsive to receiving the multiplexed laser beam at the first end of the optical waveguide, the multiplexed laser beam comprising the laser beam and the other laser beam.

Clause 25. The computer-implemented method of Clause 24, wherein: the laser device further comprises a selective turning mirror configured to transmit the laser beam and reflect the other laser beam and a turning mirror configured to reflect the laser beam and reflect the other laser beam; and the selective turning mirror and the turning mirror are positioned relative to the laser source, the other laser source, and the first end of the optical waveguide such that (i) the laser beam is received at the first end of the optical waveguide after the laser beam is transmitted through the selective turning mirror and then reflected off the turning mirror, (ii) the other laser beam is received at the first end of the optical waveguide after the laser beam is reflected off the selective turning mirror and then reflected off the turning mirror, and (iii) the laser beam and the other laser beam are concurrently received at the first end of the optical waveguide as the multiplexed laser beam.

Clause 26. The computer-implemented method of either Clause 24 or 25, wherein: the laser device further comprises a focusing lens configured to focus the multiplexed laser beam; and the focusing lens is positioned relative to the first end of the optical waveguide such that the multiplexed laser beam is focused by the focusing lens before the multiplexed laser beam is received at the first end of the optical waveguide.

Clause 27. The computer-implemented method of any one of Clauses 24 through 26, wherein: the laser beam has a wavelength between 450-460 nanometers while the laser source is operating in the quasi-continuous-wave mode; and/or the other laser beam has a wavelength between 1060-1070 nanometers while the other laser source is operating in the quasi-continuous-wave mode.

Clause 28. The computer-implemented method of any one of Clauses 24 through 27, wherein: the laser beam has a pulse duration between 500-50,000 microseconds while the laser source is operating in the pulsed-wave mode or the quasi-pulsed-wave mode; and the other laser beam has a pulse duration between 500-50,000 microseconds while the other laser source is operating in the pulsed-wave mode or the quasi-pulsed-wave mode.

Clause 29. The computer-implemented method of any one of Clauses 24 through 28, wherein: the laser beam has a power output between 10-30 watts; and the other laser beam has a power output between 10-80 watts.

Clause 30. The computer-implemented method of any one of Clauses 22 through 29, wherein: the laser device further comprises an RFID reader configured to read from and write to an RFID tag embedded within the optical waveguide, wherein the RFID tag comprises a unique identifier associated with the optical waveguide; and the method further comprises: causing the RFID reader to read the unique identifier from the RFID tag; identifying the optical waveguide based on the unique identifier; and writing a use identifier to the RFID tag, wherein the use identifier indicates that the optical waveguide has been used in a surgical procedure.

Clause 31. The computer-implemented method of Clause 30, further comprising: causing the RFID reader to read the use identifier from the RFID tag; determining that the optical waveguide has been used in a surgical procedure based on the use identifier; and rejecting the optical waveguide responsive to determining that the optical waveguide has been used in a surgical procedure.

Clause 32. A non-transitory, computer-readable medium storing instructions that, when executed by a processor of a laser device, cause the laser device to perform operations comprising: receiving a user request to operate a laser device in a requested mode comprising either (i) a pulsed-wave mode, (ii) a quasi-pulsed-wave mode, (iii) a continuous-wave mode, or (iv) a quasi-continuous-wave mode; responsive to receiving the user request, causing a signal generator of the laser device to generate a laser control signal in accordance with the requested mode; wherein the signal generator is configured to separately generate two or more of (i) a pulsed-wave signal, (ii) a quasi-pulsed-wave signal, (iii) a continuous-wave signal, and (iv) a quasi-continuous-wave signal for transmission as a laser control signal; wherein a laser source of the laser device is configured to receive the laser control signal and emit a laser beam responsive to receiving the laser control signal and in accordance with the laser control signal, wherein the laser beam comprises either (i) a pulsed-wave laser beam, (ii) a quasi-pulsed-wave laser beam, (iii) a continuous-wave laser beam, or (iv) a quasi-continuous-wave laser beam; and wherein an optical waveguide is configured to emit the laser beam from a second end of the optical waveguide after receiving the laser beam at a first end of the optical waveguide.

Clause 33. The non-transitory, computer-readable medium of Clause 32, wherein the operations further comprise, after causing the signal generator to generate the laser control signal in accordance with the requested mode: receiving another user request to operate in another requested mode comprising either (i) the pulsed-wave mode, (ii) the quasi-pulsed-wave mode, (iii) the continuous-wave mode, or (iv) the quasi-continuous-wave mode; and responsive to receiving the other user request, causing the signal generator to generate the laser control signal in accordance with the other requested mode.

Clause 34. The non-transitory, computer-readable medium of either Clause 32 or 33, wherein: the laser device further comprises another laser source configured to receive the laser control signal and emit another laser beam responsive to receiving the laser control signal and in accordance with the laser control signal, the other laser beam comprising either (i) a pulsed-wave laser beam, (ii) a quasi-pulsed-wave laser beam, (iii) a continuous-wave laser beam, or (iv) a quasi-continuous-wave laser beam; and the optical waveguide is further configured to emit a multiplexed laser beam from the second end of the optical waveguide responsive to receiving the multiplexed laser beam at the first end of the optical waveguide, the multiplexed laser beam comprising the laser beam and the other laser beam.

Clause 35. The non-transitory, computer-readable medium of Clause 34, wherein: the laser device further comprises a selective turning mirror configured to transmit the laser beam and reflect the other laser beam and a turning mirror configured to reflect the laser beam and reflect the other laser beam; and the selective turning mirror and the turning mirror are positioned relative to the laser source, the other laser source, and the first end of the optical waveguide such that (i) the laser beam is received at the first end of the optical waveguide after the laser beam is transmitted through the selective turning mirror and then reflected off the turning mirror, (ii) the other laser beam is received at the first end of the optical waveguide after the laser beam is reflected off the selective turning mirror and then reflected off the turning mirror, and (iii) the laser beam and the other laser beam are concurrently received at the first end of the optical waveguide as the multiplexed laser beam.

Clause 36. The non-transitory, computer-readable medium of either Clause 34 or 35, wherein: the laser device further comprises a focusing lens configured to focus the multiplexed laser beam; and the focusing lens is positioned relative to the first end of the optical waveguide such that the multiplexed laser beam is focused by the focusing lens before the multiplexed laser beam is received at the first end of the optical waveguide.

Clause 37. The non-transitory, computer-readable medium of any one of Clauses 34 through 36, wherein: the laser beam has a wavelength between 450-460 nanometers while the laser source is operating in the quasi-continuous-wave mode; and/or the other laser beam has a wavelength between 1060-1070 nanometers while the other laser source is operating in the quasi-continuous-wave mode.

Clause 38. The non-transitory, computer-readable medium of any one of Clauses 34 through 37, wherein: the laser beam has a pulse duration between 500-50,000 microseconds while the laser source is operating in the pulsed-wave mode or the quasi-pulsed-wave mode; and the other laser beam has a pulse duration between 500-50,000 microseconds while the other laser source is operating in the pulsed-wave mode or the quasi-pulsed-wave mode.

Clause 39. The non-transitory, computer-readable medium of any one of Clauses 34 through 38, wherein: the laser beam has a power output between 10-30 watts; and the other laser beam has a power output between 10-80 watts.

Clause 40. The non-transitory, computer-readable medium of any one of Clauses 32 through 39, wherein: the laser device further comprises an RFID reader configured to read from and write to an RFID tag embedded within the optical waveguide, wherein the RFID tag comprises a unique identifier associated with the optical waveguide; and the operations further comprise: causing the RFID reader to read the unique identifier from the RFID tag; identifying the optical waveguide based on the unique identifier; and writing a use identifier to the RFID tag, wherein the use identifier indicates that the optical waveguide has been used in a surgical procedure.

Clause 41. The non-transitory, computer-readable medium of Clause 40, wherein the operations further comprise: causing the RFID reader to read the use identifier from the RFID tag; determining that the optical waveguide has been used in a surgical procedure based on the use identifier; and rejecting the optical waveguide responsive to determining that the optical waveguide has been used in a surgical procedure.

Clause 42. A method of manufacturing a laser device, the method comprising: providing a signal generator configured to separately generate two or more of (i) a pulsed-wave signal, (ii) a quasi-pulsed-wave signal, (iii) a continuous-wave signal, and (iv) a quasi-continuous-wave signal for transmission as a laser control signal; providing a laser source configured to receive the laser control signal and emit a laser beam responsive to receiving the laser control signal and in accordance with the laser control signal, wherein the laser beam comprises either (i) a pulsed-wave laser beam, (ii) a quasi-pulsed-wave laser beam, (iii) a continuous-wave laser beam, or (iv) a quasi-continuous-wave laser beam; providing control circuitry configured to: receive a user request to operate in a requested mode comprising either (i) a pulsed-wave mode, (ii) a quasi-pulsed-wave mode, (iii) a continuous-wave mode, or (iv) a quasi-continuous-wave mode; responsive to receiving the user request, cause the signal generator to generate the laser control signal in accordance with the requested mode; providing a housing for the signal generator, the laser source, and the control circuitry; situating the signal generator, the laser source, and the control circuitry in the housing; and connecting the control circuitry to the signal generator and the laser source; wherein an optical waveguide is configured to emit the laser beam from a second end of the optical waveguide after receiving the laser beam at a first end of the optical waveguide while the first end of the optical waveguide is connected to the housing.

Clause 43. The method of manufacturing of Clause 42, wherein the control circuitry is further configured to, after causing the signal generator to generate the laser control signal in accordance with the requested mode: receive another user request to operate in another requested mode comprising either (i) the pulsed-wave mode, (ii) the quasi-pulsed-wave mode, (iii) the continuous-wave mode, or (iv) the quasi-continuous-wave mode; and responsive to receiving the other user request, cause the signal generator to generate the laser control signal in accordance with the other requested mode.

Clause 44. The method of manufacturing of either Clause 42 or 43, further comprising: providing another laser source configured to receive the laser control signal and emit another laser beam responsive to receiving the laser control signal and in accordance with the laser control signal, wherein the other laser beam comprises either (i) a pulsed-wave laser beam, (ii) a quasi-pulsed-wave laser beam, (iii) a continuous-wave laser beam, or (iv) a quasi-continuous-wave laser beam; situating the other laser source in the housing; and connecting the control circuitry to the other laser source; wherein the optical waveguide is further configured to emit a multiplexed laser beam from the second end of the optical waveguide responsive to receiving the multiplexed laser beam at the first end of the optical waveguide, the multiplexed laser beam comprising the laser beam and the other laser beam.

Clause 45. The method of manufacturing of Clause 44, further comprising: providing a selective turning mirror configured to transmit the laser beam and reflect the other laser beam; providing a turning mirror configured to reflect the laser beam and reflect the other laser beam; and situating the selective turning mirror and the turning mirror in the housing, wherein the selective turning mirror and the turning mirror are positioned relative to the laser source, the other laser source, and a portion of the housing configured to connect to the first end of the optical waveguide such that (i) the laser beam is received at the first end of the optical waveguide after the laser beam is transmitted through the selective turning mirror and then reflected off the turning mirror, (ii) the other laser beam is received at the first end of the optical waveguide after the laser beam is reflected off the selective turning mirror and then reflected off the turning mirror, and (iii) the laser beam and the other laser beam are concurrently received at the first end of the optical waveguide as the multiplexed laser beam.

Clause 46. The method of manufacturing of either Clause 44 or 45, further comprising: providing a focusing lens configured to focus the multiplexed laser beam; and situating the focusing lens in the housing, wherein the focusing lens is positioned relative to a portion of the housing configured to connect to the first end of the optical waveguide such that the multiplexed laser beam is focused by the focusing lens before the multiplexed laser beam is received at the first end of the optical waveguide.

Clause 47. The method of manufacturing of any one of Clauses 44 through 46, wherein: the laser beam has a wavelength between 450-460 nanometers while the laser source is operating in the quasi-continuous-wave mode; and/or the other laser beam has a wavelength between 1060-1070 nanometers while the other laser source is operating in the quasi-continuous-wave mode.

Clause 48. The method of manufacturing of any one of Clauses 44 through 47, wherein: the laser beam has a pulse duration between 500-50,000 microseconds while the laser source is operating in the pulsed-wave mode or the quasi-pulsed-wave mode; and the other laser beam has a pulse duration between 500-50,000 microseconds while the other laser source is operating in the pulsed-wave mode or the quasi-pulsed-wave mode.

Clause 49. The method of manufacturing of any one of Clauses 44 through 48, wherein: the laser beam has a power output between 10-30 watts; and the other laser beam has a power output between 10-80 watts.

Clause 50. The method of manufacturing of any one of Clauses 42 through 49, further comprising: providing an RFID reader configured to read from and write to an RFID tag embedded within the optical waveguide, wherein the RFID tag comprises a unique identifier associated with the optical waveguide; situating the RFID reader in the housing; and connecting the control circuitry to the RFID reader; wherein the control circuitry is further configured to: cause the RFID reader to read the unique identifier from the RFID tag; identify the optical waveguide based on the unique identifier; and write a use identifier to the RFID tag, wherein the use identifier indicates that the optical waveguide has been used in a surgical procedure.

Clause 51. The method of manufacturing of Clause 50, wherein the control circuitry is further configured to: cause the RFID reader to read the use identifier from the RFID tag; determine that the optical waveguide has been used in a surgical procedure based on the use identifier; and reject the optical waveguide responsive to determining that the optical waveguide has been used in a surgical procedure.

Further Consideration. The specific order or hierarchy of steps in the processes disclosed herein is an illustration of example approaches. Based upon design preferences, it is understood that the specific order or hierarchy of steps in the processes may be rearranged. Some of the steps may be performed simultaneously. The accompanying method claims present elements of the various steps in a sample order, and are not meant to be limited to the specific order or hierarchy presented.

The previous description is provided to enable any person skilled in the art to practice the various aspects described herein. The previous description provides various examples of the subject technology, and the subject technology is not limited to these examples. Various modifications to these aspects will be readily apparent to those skilled in the art, and the generic principles defined herein may be applied to other aspects. Thus, the claims are not in-tended to be limited to the aspects shown herein, but is to be accorded the full scope consistent with the language claims, wherein reference to an element in the singular is not intend-ed to mean "one and only one" unless specifically so stated, but rather "one or more." Unless specifically stated otherwise, the term "some" refers to one or more. Headings and subheadings, if any, are used for convenience only and do not limit the invention described herein.

The predicate words "configured to," "operable to," and "programmed to" do not imply any particular tangible or intangible modification of a subject, but rather are intended to be used interchangeably. For example, a processor configured to monitor and control an operation or a component may also mean the processor being programmed to monitor and control the operation or the processor being operable to monitor and control the operation. Likewise, a processor configured to execute code can be construed as a processor programmed to execute code or operable to execute code.

A phrase such as an "aspect" does not imply that such aspect is essential to the subject technology or that such aspect applies to all configurations of the subject technology. A disclosure relating to an aspect may apply to all configurations, or one or more configurations. An aspect may provide one or more examples. A phrase such as an aspect may refer to one or more aspects and vice versa. A phrase such as an "implementation" does not imply that such implementation is essential to the subject technology or that such implementation applies to all configurations of the subject technology. A disclosure relating to an implementation may apply to all implementations, or one or more implementations. An implementation may provide one or more examples. A phrase such as "implementations" may refer to one or more embodiments and vice versa. A phrase such as a "configuration" does not imply that such configuration is essential to the subject technology or that such configuration applies to all configurations of the subject technology. A disclosure relating to a configuration may apply to all configurations, or one or more configurations. A configuration may provide one or more examples. A phrase such as a "configuration" may refer to one or more configurations and vice versa.

As used herein, the terms "determine" and "determining" encompass a wide variety of actions. For example, "determining" may include calculating, computing, processing, deriving, generating, obtaining, looking up (e.g., looking up in a table, a database or another data structure), ascertaining and the like via a hardware element without user intervention. Also, "determining" may include receiving (e.g., receiving information), accessing (e.g., accessing data in a memory) and the like via a hardware element without user intervention. "Determining" may include resolving, selecting, choosing, establishing, and the like via a hardware element without user intervention.

As used herein, the term "message" encompasses a wide variety of formats for communicating (e.g., transmitting or receiving) information. A message may include a machine readable aggregation of information such as an XML document, fixed field message, comma separated message, JSON, a custom protocol, or the like. A message may, in some embodiments, include a signal utilized to transmit one or more representations of the information. While recited in the singular, it will be appreciated that a message may be composed, transmitted, stored, received, and so on in multiple parts.

As used herein, the term "selectively" or "selective" may encompass a wide variety of actions. For example, a "selective" process may include determining one option from multiple options. A "selective" process may include one or more of: dynamically determined in-puts, preconfigured inputs, or user-initiated inputs for making the determination. In some embodiments, an n-input switch may be included to provide selective functionality where n is the number of inputs used to make the selection.

As used herein, the terms "correspond" or "corresponding" encompasses a structural, functional, quantitative and/or qualitative correlation or relationship between two or more objects, data sets, information and/or the like, preferably where the correspondence or relationship may be used to translate one or more of the two or more objects, data sets, information and/or the like so to appear to be the same or equal. Correspondence may be assessed using one or more of a threshold, a value range, fuzzy logic, pattern matching, a machine-learning assessment model, or combinations thereof.

In any embodiment, data generated or detected can be forwarded to a "remote" device or location, where "remote," means a location or device other than the location or device at which the program is executed. For example, a remote location could be another location (e.g., office, lab, etc.) in the same city, another location in a different city, another location in a different state, another location in a different country, etc. As such, when one item is indicated as being "remote" from another, what is meant is that the two items can be in the same room but separated, or at least in different rooms or different buildings, and can be at least one mile, ten miles, or at least one hundred miles apart. "Communicating" information references transmitting the data representing that information as electrical signals over a suitable communication channel (e.g., a private or public network). "Forwarding" an item refers to any means of getting that item from one location to the next, whether by physically transporting that item or otherwise (where that is possible) and includes, at least in the case of data, physically transporting a medium carrying the data or communicating the data. Examples of communicating media include radio or infra-red transmission channels as well as a network connection to another computer or networked device, and the internet or including email transmissions and information recorded on websites and the like.

What is claimed is:

1. A laser device comprising:
    a signal generator configured to separately generate two or more of (i) a pulsed-wave signal, (ii) a quasi-pulsed-wave signal, (iii) a continuous-wave signal, or (iv) a quasi-continuous-wave signal for transmission as a laser control signal;
    a laser source configured to receive the laser control signal and emit a laser beam responsive to receiving the laser control signal and in accordance with the laser control signal, wherein the laser beam comprises (i) a pulsed-wave laser beam, (ii) a quasi-pulsed-wave laser beam, (iii) a continuous-wave laser beam, or (iv) a quasi-continuous-wave laser beam;
    another laser source configured to receive the laser control signal and emit another laser beam responsive to receiving the laser control signal and in accordance with the laser control signal, wherein the other laser beam comprises (i) a pulsed-wave laser beam, (ii) a quasi-pulsed-wave laser beam, (iii) a continuous-wave laser beam, or (iv) a quasi-continuous-wave laser beam;
    a selective turning mirror configured to transmit the laser beam and reflect the other laser beam;
    a turning mirror configured to reflect the laser beam and reflect the other laser beam;
    an RFID reader configured to read from and write to an RFID tag embedded within an optical waveguide, wherein the RFID tag comprises a unique identifier associated with the optical waveguide, and the optical waveguide is configured to emit the laser beam from a second end of the optical waveguide after receiving the laser beam at a first end of the optical waveguide; and
    control circuitry configured to:
        receive a user request to operate in a requested mode comprising (i) a pulsed-wave mode, (ii) a quasi-pulsed-wave mode, (iii) a continuous-wave mode, or (iv) a quasi-continuous-wave mode;
        responsive to receiving the user request, cause the signal generator to generate the laser control signal in accordance with the requested mode;
        cause the RFID reader to read the unique identifier from the RFID tag;
        identify the optical waveguide based on the unique identifier; and
        write a use identifier to the RFID tag, wherein the use identifier indicates that the optical waveguide has been used in a surgical procedure;
    wherein the selective turning mirror and the turning mirror are positioned relative to the laser source, the other laser source, and a first end of an optical waveguide such that (i) the laser beam is received at the first end of the optical waveguide after the laser beam is transmitted through the selective turning mirror and then reflected off the turning mirror, (ii) the other laser beam is received at the first end of the optical waveguide after the laser beam is reflected off the selective turning mirror and then reflected off the turning mirror, and (iii) the laser beam and the other laser beam are concurrently received at the first end of the optical waveguide as a multiplexed laser beam comprising the laser beam and the other laser beam.

2. A laser device comprising:
    a signal generator configured to separately generate two or more of (i) a pulsed-wave signal, (ii) a quasi-pulsed-wave signal, (iii) a continuous-wave signal, and (iv) a quasi-continuous-wave signal for transmission as a laser control signal;
    a laser source configured to receive the laser control signal and emit a laser beam responsive to receiving the laser control signal and in accordance with the laser control signal, wherein the laser beam comprises either (i) a pulsed-wave laser beam, (ii) a quasi-pulsed-wave laser beam, (iii) a continuous-wave laser beam, or (iv) a quasi-continuous-wave laser beam;
    an RFID reader configured to read from and write to an RFID tag embedded within an optical waveguide, wherein the RFID tag comprises a unique identifier associated with the optical waveguide, and the optical waveguide is configured to emit the laser beam from a second end of the optical waveguide after receiving the laser beam at a first end of the optical waveguide; and
    control circuitry configured to:
        receive a user request to operate in a requested mode comprising either (i) a pulsed-wave mode, (ii) a quasi-pulsed-wave mode, (iii) a continuous-wave mode, or (iv) a quasi-continuous-wave mode;
        responsive to receiving the user request, cause the signal generator to generate the laser control signal in accordance with the requested mode;
        cause the RFID reader to read the unique identifier from the RFID tag;
        identify the optical waveguide based on the unique identifier; and
        write a use identifier to the RFID tag, wherein the use identifier indicates that the optical waveguide has been used in a surgical procedure.

3. The laser device of claim 2, wherein the control circuitry is further configured to, after causing the signal generator to generate the laser control signal in accordance with the requested mode:
    receive another user request to operate in another requested mode comprising either (i) the pulsed-wave mode, (ii) the quasi-pulsed-wave mode, (iii) the continuous-wave mode, or (iv) the quasi-continuous-wave mode; and
    responsive to receiving the other user request, cause the signal generator to generate the laser control signal in accordance with the other requested mode.

4. The laser device of claim 2, further comprising:
    another laser source configured to receive the laser control signal and emit another laser beam responsive to receiving the laser control signal and in accordance with the laser control signal, wherein the other laser beam comprises either (i) a pulsed-wave laser beam, (ii) a quasi-pulsed-wave laser beam, (iii) a continuous-wave laser beam, or (iv) a quasi-continuous-wave laser beam;
    wherein the optical waveguide is further configured to emit a multiplexed laser beam from the second end of the optical waveguide responsive to receiving the multiplexed laser beam at the first end of the optical waveguide, the multiplexed laser beam comprising the laser beam and the other laser beam.

5. The laser device of claim 4, further comprising:
    a selective turning mirror configured to transmit the laser beam and reflect the other laser beam; and
    a turning mirror configured to reflect the laser beam and reflect the other laser beam;
    wherein the selective turning mirror and the turning mirror are positioned relative to the laser source, the other laser source, and the first end of the optical waveguide such that (i) the laser beam is received at the first end of the optical waveguide after the laser beam is transmitted through the selective turning mirror and then reflected off the turning mirror, (ii) the other laser beam is received at the first end of the optical waveguide after the laser beam is reflected off the selective turning mirror and then reflected off the turning mirror, and (iii) the laser beam and the other laser beam are concurrently received at the first end of the optical waveguide as the multiplexed laser beam.

6. The laser device of claim 4 further comprising:
a focusing lens configured to focus the multiplexed laser beam;
wherein the focusing lens is positioned relative to the first end of the optical waveguide such that the multiplexed laser beam is focused by the focusing lens before the multiplexed laser beam is received at the first end of the optical waveguide.

7. The laser device of claim 4, wherein:
the laser beam has a wavelength between 445-465 nanometers while the laser source is operating in the quasi-continuous-wave mode.

8. The laser device of claim 4, wherein:
the laser beam has a pulse duration between 500-50,000 microseconds while the laser source is operating in the pulsed-wave mode or the quasi-pulsed-wave mode; and
the other laser beam has a pulse duration between 500-50,000 microseconds while the other laser source is operating in the pulsed-wave mode or the quasi-pulsed-wave mode.

9. The laser device of claim 4, wherein:
the laser beam has a power output between 10-30 watts; and
the other laser beam has a power output between 10-80 watts.

10. The laser device of claim 2, wherein the control circuitry is further configured to:
cause the RFID reader to read the use identifier from the RFID tag;
determine that the optical waveguide has been used in a surgical procedure based on the use identifier; and
reject the optical waveguide responsive to determining that the optical waveguide has been used in a surgical procedure.

11. A laser system comprising:
a signal generator configured to separately generate two or more of (i) a pulsed-wave signal, (ii) a quasi-pulsed-wave signal, (iii) a continuous-wave signal, and (iv) a quasi-continuous-wave signal for transmission as a laser control signal;
a laser source configured to receive the laser control signal and emit a laser beam responsive to receiving the laser control signal and in accordance with the laser control signal, wherein the laser beam comprises either (i) a pulsed-wave laser beam, (ii) a quasi-pulsed-wave laser beam, (iii) a continuous-wave laser beam, or (iv) a quasi-continuous-wave laser beam;
an optical waveguide configured to emit the laser beam from a second end of the optical waveguide after receiving the laser beam at a first end of the optical waveguide;
an RFID reader configured to read from and write to an RFID tag embedded within the optical waveguide, wherein the RFID tag comprises a unique identifier associated with the optical waveguide; and
control circuitry configured to:

receive a user request to operate in a requested mode comprising either (i) a pulsed-wave mode, (ii) a quasi-pulsed-wave mode, (iii) a continuous-wave mode, or (iv) a quasi-continuous-wave mode;
responsive to receiving the user request, cause the signal generator to generate the laser control signal in accordance with the requested mode;
cause the RFID reader to read the unique identifier from the RFID tag;
identify the optical waveguide based on the unique identifier; and
write a use identifier to the RFID tag, wherein the use identifier indicates that the optical waveguide has been used in a surgical procedure.

12. The laser system of claim 11, wherein the control circuitry is further configured to, after causing the signal generator to generate the laser control signal in accordance with the requested mode:
receive another user request to operate in another requested mode comprising either (i) the pulsed-wave mode, (ii) the quasi-pulsed-wave mode, (iii) the continuous-wave mode, or (iv) the quasi-continuous-wave mode; and
responsive to receiving the other user request, cause the signal generator to generate the laser control signal in accordance with the other requested mode.

13. The laser system of claim 11, further comprising:
another laser source configured to receive the laser control signal and emit another laser beam responsive to receiving the laser control signal and in accordance with the laser control signal, wherein the other laser beam comprises either (i) a pulsed-wave laser beam, (ii) a quasi-pulsed-wave laser beam, (iii) a continuous-wave laser beam, or (iv) a quasi-continuous-wave laser beam;
wherein the optical waveguide is further configured to emit a multiplexed laser beam from the second end of the optical waveguide responsive to receiving the multiplexed laser beam at the first end of the optical waveguide, the multiplexed laser beam comprising the laser beam and the other laser beam.

14. The laser system of claim 13, further comprising:
a selective turning mirror configured to transmit the laser beam and reflect the other laser beam; and
a turning mirror configured to reflect the laser beam and reflect the other laser beam;
wherein the selective turning mirror and the turning mirror are positioned relative to the laser source, the other laser source, and the first end of the optical waveguide such that (i) the laser beam is received at the first end of the optical waveguide after the laser beam is transmitted through the selective turning mirror and then reflected off the turning mirror, (ii) the other laser beam is received at the first end of the optical waveguide after the laser beam is reflected off the selective turning mirror and then reflected off the turning mirror, and (iii) the laser beam and the other laser beam are concurrently received at the first end of the optical waveguide as the multiplexed laser beam.

15. The laser system of claim 13, further comprising:
a focusing lens configured to focus the multiplexed laser beam;
wherein the focusing lens is positioned relative to the first end of the optical waveguide such that the multiplexed laser beam is focused by the focusing lens before the multiplexed laser beam is received at the first end of the optical waveguide.

16. The laser system of claim 13, wherein:
the laser beam has a wavelength between 450-460 nanometers while the laser source is operating in the quasi-continuous-wave mode; and
the other laser beam has a wavelength between 1060-1070 nanometers while the other laser source is operating in the quasi-continuous-wave mode.

17. The laser system of claim 13, wherein:
the laser beam has a pulse duration between 500-50,000 microseconds while the laser source is operating in the pulsed-wave mode or the quasi-pulsed-wave mode; and
the other laser beam has a pulse duration between 500-50,000 microseconds while the other laser source is operating in the pulsed-wave mode or the quasi-pulsed-wave mode.

18. The laser system of claim 13, wherein:
the laser beam has a power output between 10-30 watts; and
the other laser beam has a power output between 10-80 watts.

19. The laser system of claim 11, wherein the control circuitry is further configured to:
cause the RFID reader to read the use identifier from the RFID tag;
determine that the optical waveguide has been used in a surgical procedure based on the use identifier; and
reject the optical waveguide responsive to determining that the optical waveguide has been used in a surgical procedure.

20. The laser device of claim 2, wherein the signal generator is further configured to generate three or more of (i) the pulsed-wave signal, (ii) the quasi-pulsed-wave signal, (iii) the continuous-wave signal, and (iv) the quasi-continuous-wave signal for transmission as the laser control signal.

21. The laser system of claim 11, wherein the signal generator is further configured to generate three or more of (i) the pulsed-wave signal, (ii) the quasi-pulsed-wave signal, (iii) the continuous-wave signal, and (iv) the quasi-continuous-wave signal for transmission as the laser control signal.

* * * * *